United States Patent
Ito

(10) Patent No.: US 9,143,118 B2
(45) Date of Patent: Sep. 22, 2015

(54) SEMICONDUCTOR MEMORY DEVICE WITH POWER INTERRUPTION DETECTION AND RESET CIRCUIT

(75) Inventor: Takashi Ito, Kawasaki (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/350,775

(22) PCT Filed: Oct. 11, 2011

(86) PCT No.: PCT/JP2011/073310
§ 371 (c)(1),
(2), (4) Date: Apr. 9, 2014

(87) PCT Pub. No.: WO2013/054389
PCT Pub. Date: Apr. 18, 2013

(65) Prior Publication Data
US 2014/0233328 A1    Aug. 21, 2014

(51) Int. Cl.
H03K 3/3565    (2006.01)
G11C 7/20     (2006.01)
H03K 17/22    (2006.01)
G11C 5/14     (2006.01)
G11C 7/12     (2006.01)
G11C 7/02     (2006.01)

(52) U.S. Cl.
CPC .............. *H03K 3/3565* (2013.01); *G11C 5/147* (2013.01); *G11C 7/02* (2013.01); *G11C 7/12* (2013.01); *G11C 7/20* (2013.01); *H03K 17/223* (2013.01)

(58) Field of Classification Search
CPC ............ G11C 7/12; G11C 7/02; G11C 5/147; G11C 7/20; H03K 17/223
See application file for complete search history.

(56) References Cited

U.S. PATENT DOCUMENTS

| 5,109,163 | A  | * | 4/1992  | Benhamida ................ 327/143 |
| 6,031,774 | A  |   | 2/2000  | Chung |
| 8,233,346 | B2 |   | 7/2012  | Hirota |
| 8,344,766 | B2 |   | 1/2013  | Yoshikawa et al. |
| 2004/0263222 | A1 | * | 12/2004 | Tseng et al. ................ 327/143 |
| 2011/0074470 | A1 | * | 3/2011  | Sanborn et al. ............. 327/143 |

FOREIGN PATENT DOCUMENTS

| JP | 62-78646 A  | 4/1987 |
| JP | 11-232888 A | 8/1999 |

(Continued)

OTHER PUBLICATIONS

International Search Report PCT/JP2011/073310 dated Nov. 8, 2011 with English translation.

*Primary Examiner* — J. H. Hur
*Assistant Examiner* — Ajay Ojha
(74) *Attorney, Agent, or Firm* — McDermott Will & Emery LLP

(57) ABSTRACT

A control logic unit generates a control signal which is activated while a power supply normally operates. A charge circuit is connected to a first node on a voltage control line supplied with a voltage generated by a voltage generation circuit, so that its capacitive element is charged with electric charge. A first discharge circuit is connected to a charge storage node of the charge circuit and discharges the stored electric charge when the control signal is activated. A second discharge circuit discharges the first node when the charge storage node has a potential exceeding a predetermined potential.

10 Claims, 12 Drawing Sheets

(56) References Cited

FOREIGN PATENT DOCUMENTS

| JP | 2000-148309 A | 5/2000 |
| JP | 2008-125267 A | 5/2008 |
| JP | 2008-251096 A | 10/2008 |
| JP | 2010-080031 A | 4/2010 |
| JP | 2010-232848 A | 10/2010 |
| JP | 2011-024892 A | 2/2011 |

* cited by examiner

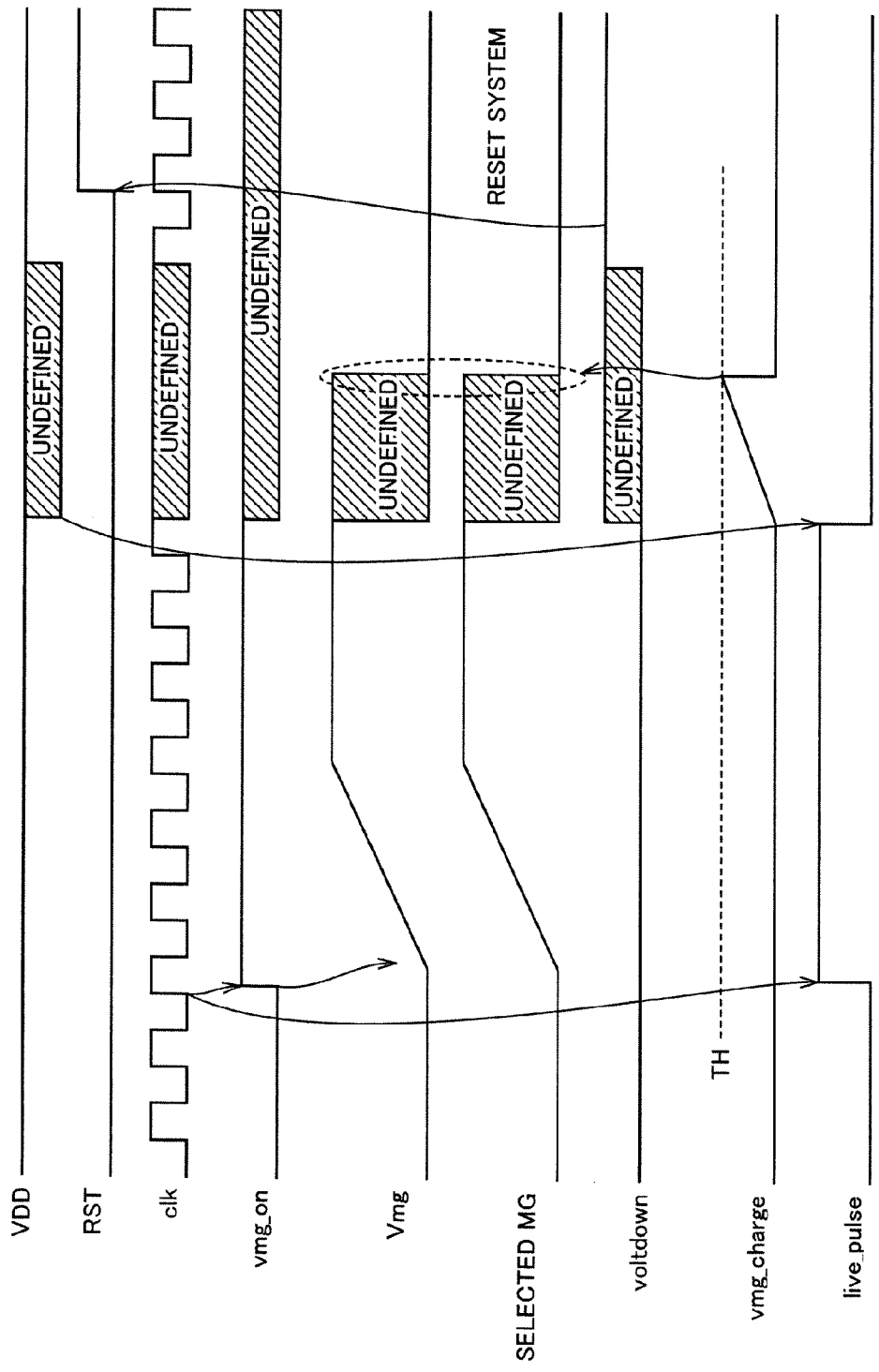

SEMICONDUCTOR MEMORY DEVICE WITH POWER INTERRUPTION DETECTION AND RESET CIRCUIT

CROSS REFERENCE TO RELATED APPLICATION

This application is the U.S. National Phase of PCT/JP2011/073310 filed Oct. 11, 2011 the subject matter of which is incorporated in entirety by reference.

TECHNICAL FIELD

The present invention relates to a semiconductor device such as a microcomputer provided with a nonvolatile semiconductor memory or provided with a nonvolatile semiconductor memory together with a central processing unit (CPU), and particularly relates to a semiconductor device using a voltage generated in a nonvolatile semiconductor memory to operate.

BACKGROUND ART

A microcomputer is provided with a power-on reset circuit or LVD (Low Voltage Detection) circuit for detecting reduction or interruption of a power supply of the microcomputer. In some cases, however, the state of a power supply in a nonvolatile semiconductor memory which is included in the microcomputer cannot be detected by this power-on reset circuit or LVD circuit, due to a variety of factors such as use of different power supplies, difference in sensitivity to noise, arrangement of components, interconnect lines, for example.

In the nonvolatile semiconductor memory, a variety of voltages are required and generated for controlling write and erase operations. If short interruption of an internal power supply occurs due to a certain factor, failure to be able to detect this abnormality may disadvantageously result in a long time to be taken to discharge remaining electric charge from a specific node to which the generated voltage has been supplied.

In order to overcome the above disadvantage, a scheme for discharging remaining electric charge after interruption of a power supply has been proposed.

For example, PTD 1 (Japanese Patent Laying-Open No. 2010-232848) discloses a scheme for discharging, in the following manner, electric charge remaining after interruption of a power supply.

A discharge circuit is configured so that it includes a plurality of NMOS transistors for the sake of discharge, an NMOS transistor for the sake of potential compensation, and a DMOS transistor for reducing the potential of an interconnect line by a coupling capacitor. When a power supply voltage is interrupted, the DMOS transistor and the potential-compensation NMOS transistor reduce the potential of the interconnect line to a negative potential, and a plurality of discharge NMOS transistors operate to reduce and discharge remaining electric charge of the interconnect line.

CITATION LIST

Patent Document

PTD 1: Japanese Patent Laying-Open No. 2010-232848

SUMMARY OF INVENTION

Technical Problem

The scheme of PTD 1, however, may be accompanied by difficulty in detecting short interruption, depending on the state of the short interruption such as to what extent the voltage has changed or the length of the short interruption, for example, and may result in the necessity of a circuit having high precision and a large area in order to overcome the difficulty. In addition, the scheme is difficult to be applied to discharge from a voltage line having a large load capacity, which may lead to a possibility that a high voltage remains.

In view of the above, an object of the present invention is to provide a semiconductor device capable of reliably discharging electric charge which remains due to an abnormality of a power supply.

Solution To Problem

In accordance with one embodiment of the present invention, there are provided: a control logic unit generating a control signal which is activated while a power supply normally operates; a charge circuit connected to a first node on a voltage control line supplied with a voltage generated by a voltage generation circuit, so that its capacitive element is charged with electric charge; a first discharge circuit connected to a charge storage node of the charge circuit and discharging the stored electric charge when the control signal is activated; and a second discharge circuit discharging the first node when the charge storage node has a potential exceeding a predetermined potential.

Advantageous Effects of Invention

In accordance with one embodiment of the present invention, electric charge which remains due to an abnormality of an internal power supply can reliably be discharged.

BRIEF DESCRIPTION OF DRAWINGS

FIG. 13 a timing chart of writing during which short interruption of an internal power supply occurs in the second embodiment.

DESCRIPTION OF EMBODIMENTS

In the following, embodiments of the present invention will be described with reference to the drawings.

[First Embodiment]

Microcomputer

Figure 1:
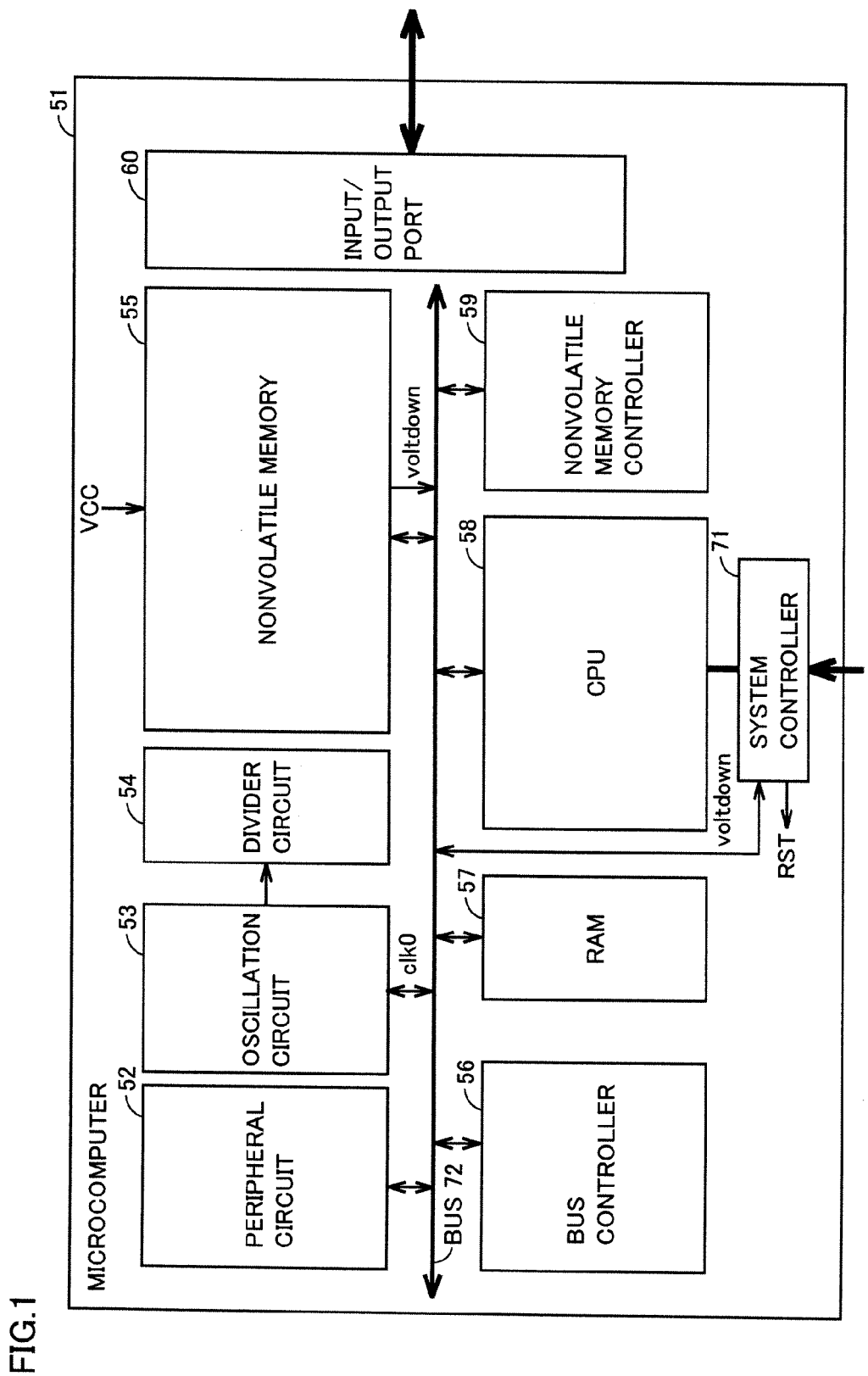
FIG. 1 is a configuration diagram of a microcomputer provided with a nonvolatile semiconductor memory in an embodiment of the present invention.

FIG. 1 is a configuration diagram of a microcomputer provided with a nonvolatile semiconductor memory in an embodiment of the present invention.

Microcomputer 51 includes a peripheral circuit 52, an oscillation circuit 53 generating reference clock clk0, a divider circuit 54 dividing reference clock clk0 generated by oscillation circuit 53, a bus controller 56 controlling transmission of a signal passed through a bus 72, a RAM (Random Access Memory) 57, a CPU 58, and a system controller 71 controlling the overall operation of microcomputer 51. Microcomputer 51 further includes a nonvolatile semiconductor memory 55, a nonvolatile semiconductor memory controller 59 controlling writing to the nonvolatile semiconductor memory in accordance with an instruction from CPU 58, and an input/output port 60 which outputs a signal to external circuitry and receives a signal from external circuitry.

When nonvolatile semiconductor memory 55 detects short interruption of a power supply in nonvolatile semiconductor memory 55, memory 55 outputs activated control signal voltdown to system controller 71. When system controller 71 receives activated control signal voltdown from nonvolatile semiconductor memory 55, controller 71 sends reset signal RST to each component of microcomputer 51 and thereby cause the component to be initialized.

Nonvolatile Semiconductor Memory

Figure 2:
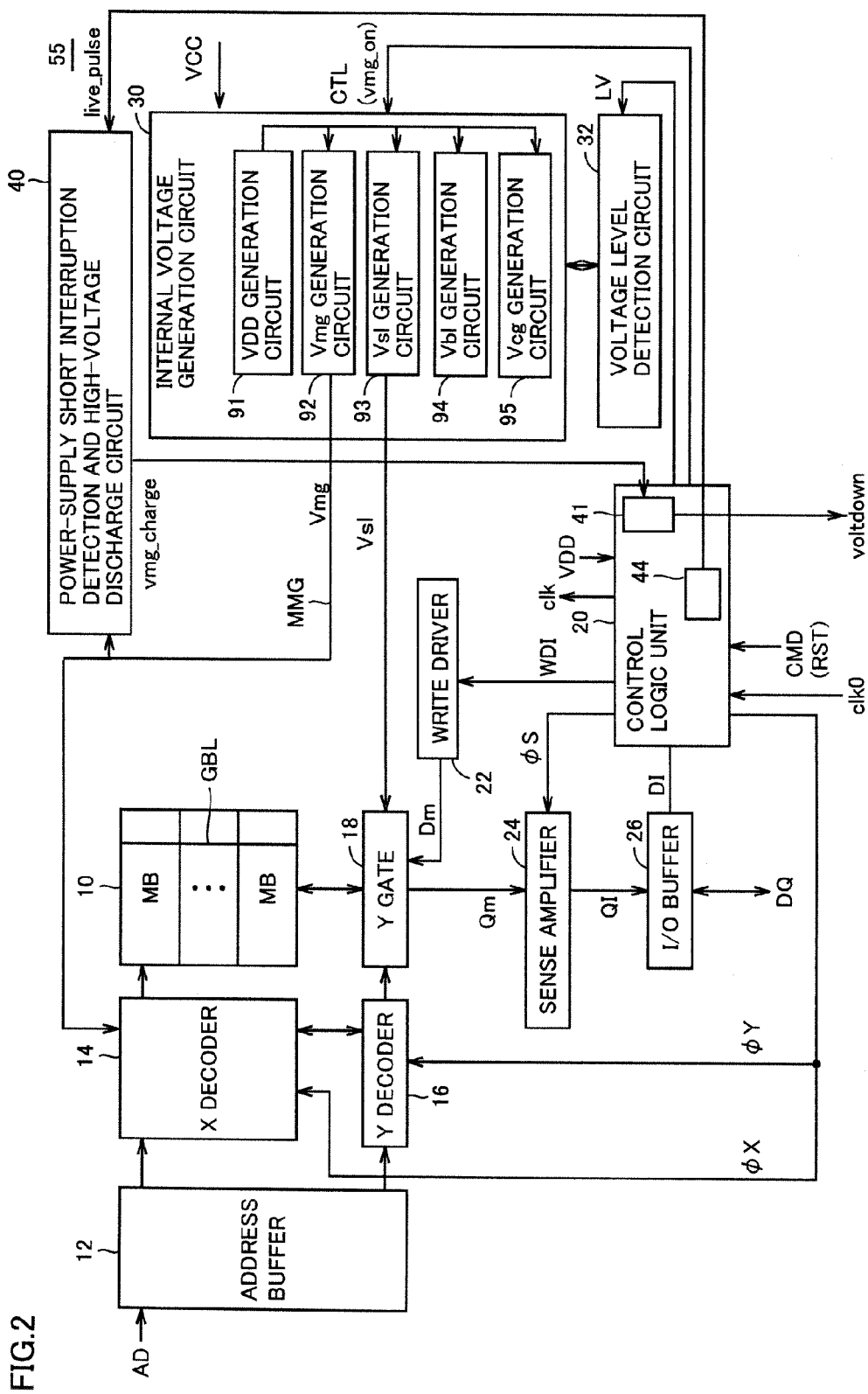
FIG. 2 is a circuit block diagram of a nonvolatile semiconductor memory.

FIG. 2 is a circuit block diagram of the nonvolatile semiconductor memory. Referring to FIG. 2, nonvolatile semiconductor memory 55 includes a memory mat 10 where a plurality of memory cells MC are arranged, an address buffer 12 generating an address specifying memory cell MC of memory mat 10, and an X decoder 14 and a Y decoder 16 selecting an addressed memory cell of memory mat 10, in accordance with an internal address given from address buffer 12.

Memory mat 10 is divided into a plurality of memory blocks MB, and each memory block MB includes a plurality of memory cells MC. Memory cells MC included in memory block MB have the configuration shown in FIGS. 3 and 4. In memory block MB, a control gate line CG and a memory gate line MG are arranged for each memory cell row, and a source line SL is also arranged for each memory cell row. For each memory cell column, a common bit line BL is arranged. For each memory cell column, a global bit line GBL which is common to a plurality of memory blocks MB is arranged. The voltage level of the selected state of each signal line varies depending on the operation mode.

When nonvolatile semiconductor memory 55 is to be accessed (erased, written, and read), address buffer 12 generates an internal address in accordance with a given address AD. In accordance with the internal address signal from address buffer 12, X decoder 14 drives a memory cell row of memory mat 10 into the selected state.

Nonvolatile semiconductor memory 55 further includes a Y gate 18 selecting a memory cell column (global bit line GBL) of memory mat 10. In accordance with a column select signal from Y decoder 16, Y gate 18 selects global bit line GBL corresponding to the addressed column of memory mat 10. In an erase operation mode, Y gate 18 is kept electrically non-conductive.

Nonvolatile semiconductor memory 55 further includes a control logic unit 20 controlling an internal operation, a write driver 22 generating internal write data Dm when a write operation is performed, a sense amplifier 24 generating internal read data QI in accordance with memory cell data (bit line current) Qm when a read operation is performed, and an I/O buffer 26 for input and output of data from and to external circuitry.

Control logic unit 20 is formed for example by a sequence controller, and performs internal operation control necessary for execution of a specified operation mode, in accordance with command CMD which specifies an operation mode externally to nonvolatile semiconductor memory 55. For example, when reset signal RST which is a kind of command CMD is input, control logic unit 20 causes each component in nonvolatile semiconductor memory 55 to be initialized. Control logic unit 20 also generates internal crock clk from reference clock clk0 given externally to nonvolatile semiconductor memory 55.

Control logic unit 20 includes a reset request circuit 41. When short interruption of an internal power supply is detected, reset request circuit 41 outputs to system controller 71 control signal voltdown for requesting the whole microcomputer 51 to be reset.

Control logic unit 20 further includes a discharge control unit 44. Discharge control unit 44 generates control signal live_pulse for controlling discharge, in accordance with internal clock clk, and applies the control signal to a power-supply short interruption detection and high-voltage discharge circuit 40. Write driver 22 generates write data Dm for memory cell MC in accordance with internal write data WDI given from control logic unit 20. Write data Dm from write driver 22 is provided through Y gate 18 to bit line BL of a selected column. In accordance with write data Dm to be applied to memory cell MC, memory cell MC is set to a written state (programmed state). At this time, bit line BL of the selected column is set for example to a ground voltage level, and data "0" is written. Bit line BL for memory cell MC which is kept in the erased state is set to a voltage level on the order of that of selected memory gate line MG.

Sense amplifier 24 detects current (cell data) Qm passed through the memory cell column (bit line BL) selected through Y gate 18 in accordance with sense control signal ϕS given from control logic unit 20, and generates internal read data Q1 in accordance with the result of detection. When a read operation is performed, I/O buffer 26 generates external read data DQ in accordance with internal read data QI from sense amplifier 24. When a write operation is performed, I/O buffer 26 generates internal write data DI in accordance with externally given write data DQ and provides the generated data to control logic unit 20.

Nonvolatile semiconductor memory 55 further includes an internal voltage generation circuit 30 generating an internal voltage necessary for each operation mode, and a voltage level detection circuit 32 detecting the level of an internal voltage generated by internal voltage generation circuit 30.

Internal voltage generation circuit 30 includes a VDD generation circuit 91, a Vmg generation circuit 92, a Vs1 generation circuit 93, a Vb1 generation circuit 94, and a Vcg generation circuit 95.

Internal voltage generation circuit 30 generates, from power supply voltage VCC externally applied to nonvolatile semiconductor memory 55, internal voltages to be used in nonvolatile semiconductor memory 55, such as internal reference voltage VDD, bit line voltage Vb1 to be transmitted to bit line BL, control gate voltage Vcg to be applied to control gate line CG, a memory gate voltage Vmg to be applied to memory gate line MG, and source line voltage Vs1 to be applied to source line SL. When short interruption occurs to a power supply from which a voltage is supplied into nonvolatile semiconductor memory 55, reference voltage VDD, bit line voltage Vb1, control gate voltage Vcg, memory gate voltage Vmg, and source line voltage Vs1 become undefined. In this example, reference voltage VDD is used as a so-called power supply voltage in various circuits, particularly control logic unit 20, in nonvolatile semiconductor memory 55. Therefore, when reference voltage VDD becomes undefined, clock clk and signals generated by components in nonvolatile semiconductor memory 55 that operate based on reference voltage VDD become undefined.

Internal voltage generation circuit 30 generates the internal voltages in accordance with control signal CTL given from control logic unit 20. Specifically, for example, in response to activation of control signal vmg_on which is a kind of control signal CTL to "H" level, memory gate voltage Vmg is stepped up. When a write operation is performed, memory gate voltage Vmg is stepped up to a high voltage (10 V or more for example). Memory gate voltage Vmg is supplied through a voltage control line MMG to X decoder 14. When short interruption occurs, due to a certain factor, to a power supply from which a voltage is supplied into nonvolatile semiconductor memory 55, the high voltage remains applied to selected memory gate line MG and voltage control line MMG, namely significant electric charge remains stored on the lines, depending on the case. In order to avoid such an undesired condition, a circuit is necessary that detects an abnormality including short interruption of power supplies in nonvolatile semiconductor memory 55 and discharges the high voltage. This function is performed by power-supply short interruption detection and high-voltage discharge circuit 40. The configuration and operation of power-supply short interruption detection and high-voltage discharge circuit 40 will be described later herein.

Voltage level detection circuit 32 adjusts the internal voltage level generated by internal voltage generation circuit 30, in accordance with voltage level specification signal LV given from control logic unit 20, as appropriate for each operation mode. Namely, voltage level detection circuit 32 sets the detection voltage level in accordance with voltage level specification signal LV, detects whether the level of the internal voltage generated by internal voltage generation circuit 30 is the specified voltage level, and controls internal voltage generation by internal voltage generation circuit 30 in accordance with the result of the detection.

Configuration of Memory Cell

Figure 3:
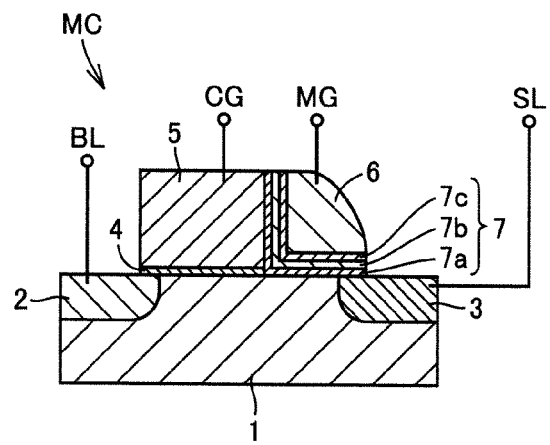
FIG. 3 is a cross-sectional view showing a configuration of a memory cell MC included in the nonvolatile semiconductor memory.

FIG. 3 is a cross-sectional view showing a configuration of memory cell MC included in the nonvolatile semiconductor memory. This memory cell MC stores data depending on a change in level of a threshold voltage.

Referring to FIG. 3, memory cell MC includes impurity regions 2, 3 formed on a semiconductor substrate region 1 with a space between regions 2 and 3, a control gate 5 formed on the surface of semiconductor substrate region 1 with a gate insulating film 4 interposed therebetween, so that control gate 5 overlaps a part of impurity region 2, an insulating film 7 formed on the sidewall of control gate 5 and on the surface of semiconductor substrate region 1, and a memory gate 6 formed on insulating film 7.

Impurity regions 2 and 3 are connected respectively to bit line BL and source lien SL. Control gate 5 and memory gate 6 are connected respectively to control gate line CG and memory gate line MG. Memory gate 6 is formed in a similar manner to that for a sidewall spacer of control gate 5. Specifically, a polysilicon film for example is deposited on control gate 5, and the polysilicon film is patterned by etching.

The memory gate length can be adjusted by means of the thickness of the polysilicon film. Therefore, even in the configuration where the two gates, namely control gate 5 and memory gate 6 are provided, memory gate 6 can be made sufficiently shorter than control gate 5 and thus increase of the memory cell size can sufficiently be made small. Insulating film 7 has a multilayer structure made up of a bottom oxide film (O film) 7a, a nitride film (N film) 7b, and a top oxide film (O film) 7c. Electric charge is stored in nitride film 7b and data (information) is stored in accordance with the amount of stored electric charge. In this memory cell MC, a select transistor ST is formed by control gate 5, impurity region 2, and semiconductor substrate region 1, while memory transistor MT is formed by memory gate 6, impurity region 3, and semiconductor substrate region 1.

Equivalent Circuit of Memory Cell MC

Figure 4:
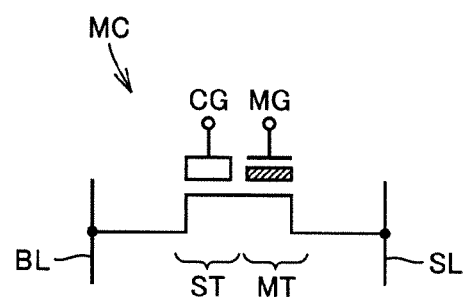
FIG. 4 is a diagram showing an electrically equivalent circuit of the memory cell MC.

FIG. 4 is a diagram showing an electrically equivalent circuit of memory cell MC.

As shown in FIG. 4, select transistor ST and memory transistor MT are connected in series between bit line BL and source line SL. Writing (programming), erasure, reading, and holding of data of memory cell MC are performed in the following way.

When a write operation is performed, a positive voltage is applied through source line SL to impurity region 3, and memory gate voltage Vmg higher than the voltage of source line SL is applied through memory gate line MG to memory gate 6. To control gate 5, a voltage slightly higher than a threshold voltage of select transistor ST is applied through control gate line CG. To bit line BL, a bit line write voltage of the same level as semiconductor substrate region 1, which is for example a ground voltage level, is applied.

Under this condition, a channel is formed under insulating film 7 in memory cell transistor MT, so that current flows from source line SL toward bit line BL. Select transistor ST is in a weakly-on state, since the voltage of control gate 5 is set to a voltage level slightly higher than the threshold voltage of select transistor ST.

Therefore, even when a channel is formed under control gate 5, the channel resistance is relatively high. Accordingly, a strong electric field is generated in the vicinity of the boundary between memory transistor MT and select transistor ST, and many hot electrons are generated in channel current of memory transistor MT. The hot electrons are injected into and trapped in insulating film 7 (nitride film 7b) under memory gate 6. This written (programmed) state is a state where the threshold voltage of memory transistor MT is high and corresponds generally to the state of storing data "0".

When an erase operation is performed, a negative voltage is applied through memory gate line MG to memory gate 6. A positive voltage is applied through source line SL to impurity region 3. Control gate line CG, bit line BL and semiconductor substrate region 1 are set to the same voltage, so that select transistor ST is in the OFF state. Under this condition, strong reversal occurs to a region where an end of impurity region 3 connected to source line SL and memory gate 6 overlap each other, inter-band tunneling phenomenon occurs and holes are generated. The generated holes (hot holes) are accelerated by the negative bias of memory gate 6 and injected into insulating film (nitride film 7b) under memory gate 6. The electrons having been injected for writing and the now injected holes are coupled together to electrically neutralize nitride film 7b, and reduce the threshold voltage of memory transistor MT.

This erased state is a state where the threshold voltage of memory transistor MT is low and generally corresponds to the state of storing data "1".

When data is read, a positive voltage is applied through control gate line CG to control gate 5, so that a channel is formed in the surface of semiconductor substrate region 1 immediately under control gate 5. To memory gate 6, a positive voltage between respective threshold voltages of the erased state and the written state is applied through memory gate line MG. In accordance with the amount of electric charge stored in insulating film 7, a channel is selectively formed in the surface of semiconductor substrate region 1 under memory gate 6. The amount of current flowing between bit line BL and source line SL through the memory cell is detected and accordingly the data stored in memory cell MC is read.

In a hold state (standby state), data is held in the form of electric charge (electrons or holes) injected into insulating film 7 under memory gate 6. Movement of electric charge in the insulating film (nitride film 7b) is small or slow. Accordingly, under the condition that no voltage is applied to memory gate 6, electric charge is held in insulating film 7, namely in nitride film 7b.

Memory Block

Figure 5:
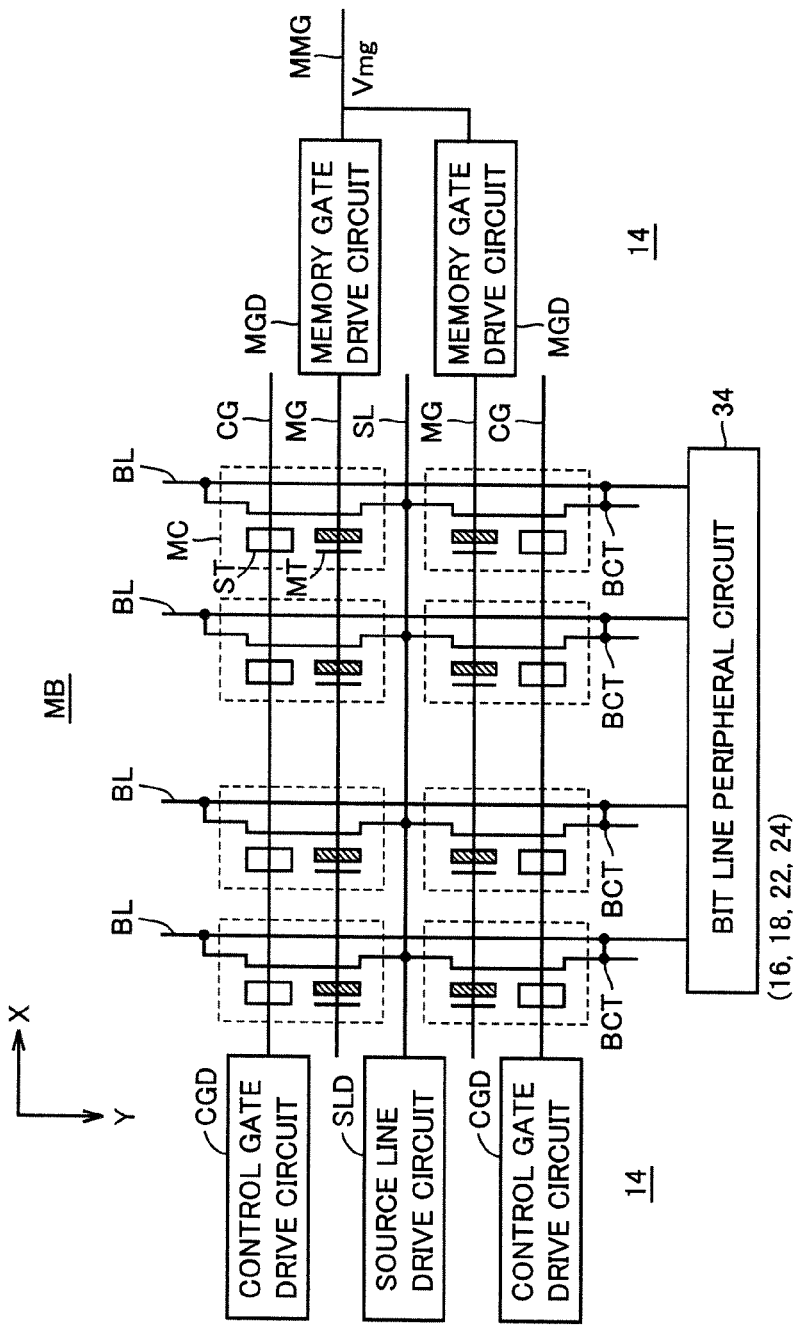
FIG. 5 is a diagram showing a configuration of a memory block MB and a configuration of its peripheral circuit.

FIG. 5 is a diagram showing a configuration of memory block MB and a configuration of its peripheral circuit. While memory block MB actually includes many memory cells MC, FIG. 5 shows eight memory cells MC in two rows and four columns for the sake of simplification of the drawing.

Memory cell MC is formed by select transistor ST and memory transistor MT connected in series to each other as shown in FIGS. 3 and 4. Control gate line CG is provided commonly to respective select transistors ST of four memory cells MC aligned in the X direction. Memory gate line MG is provided commonly to respective memory transistors MT of four memory cells MC aligned in the X direction.

Bit line BL is provided commonly to two memory cells MC aligned in the Y direction. Bit line BL is connected through bit line contact BCT to select transistors ST of memory cells MC in its associated column. Each bit line BL is connected to global bit line GBL in its associated column. Source line SL is provided commonly to eight memory cells MC arranged in the two rows.

For each control gate line CG, a control gate drive circuit CGD is provided. For source line SL, a source line drive circuit SLD is provided. For each memory gate line MG, a memory gate drive circuit MGD is provided. Control gate drive circuit CGD sets the voltage level of its associated control gate line CG. Source line drive circuit SLD sets the voltage level of its associated source line SL. Memory gate drive circuit MGD is connected with voltage control line MMG, supplies the voltage of voltage control line MMG to its associated memory gate line MG selected by means of an address signal (not shown), and sets the voltage level. Control gate drive circuit CGD, source line drive circuit SLD, and memory gate drive circuit MGD are included in X decoder 14 shown in FIG. 2.

For four bit lines BL, a bit line peripheral circuit 34 is provided. Bit line peripheral circuit 34 rewrites and reads data through bit lines BL. Bit line peripheral circuit 34 includes global bit line BL, Y decoder 16, Y gate 18, sense amplifier 24, and write driver 22.

Figure 6:
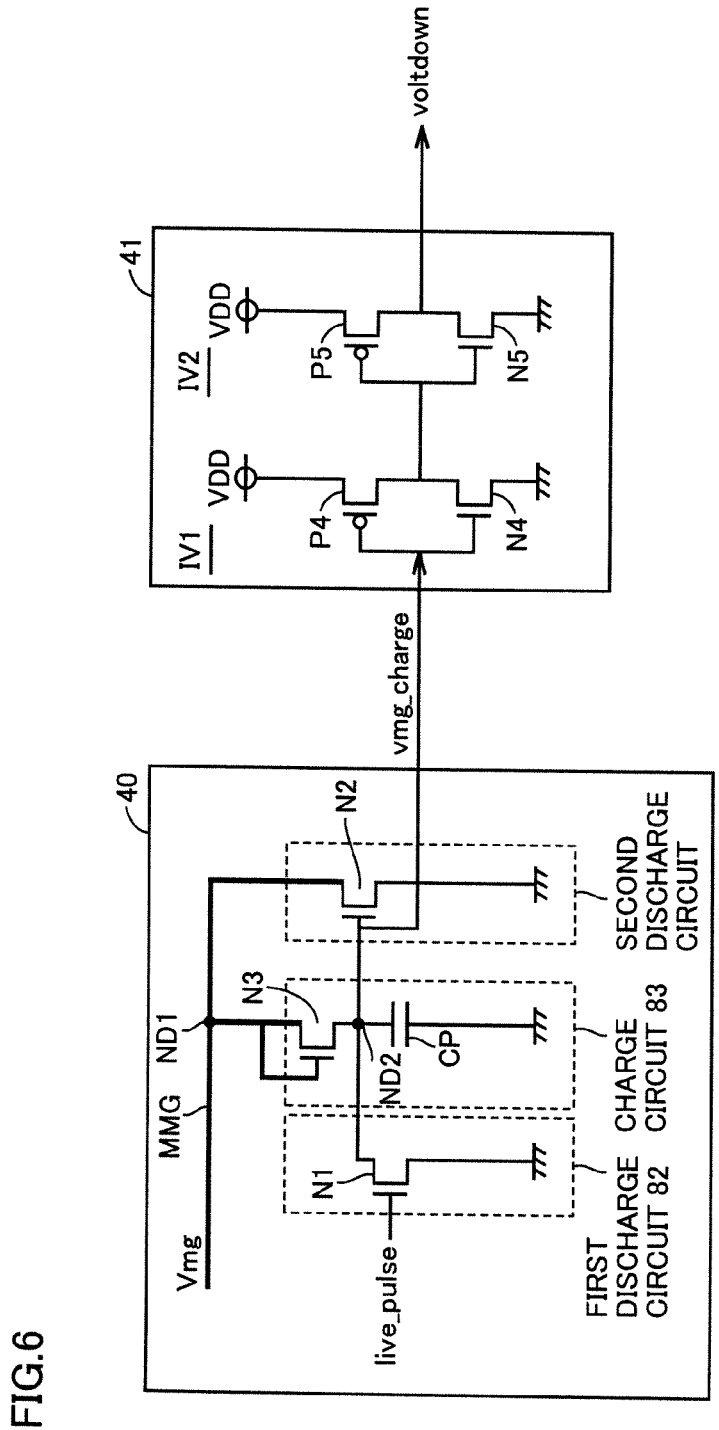
FIG. 6 is a diagram showing a configuration of a power-supply short interruption detection and high-voltage discharge circuit and a reset request circuit.

Power-Supply Short Interruption Detection and High-Voltage Discharge Circuit, Reset Request Circuit FIG. 6 is a diagram showing a configuration of the power-supply short interruption detection and high-voltage discharge circuit, and the reset request circuit.

Power-supply short interruption detection and high-voltage discharge circuit 40 includes a charge circuit 83, a first discharge circuit 82, and a second discharge circuit 84.

Charge circuit 83 is connected with a node ND1 of voltage control line MMG through which memory gate voltage Vmg is transmitted. Charge circuit 83 includes a node ND2, an NMOS transistor N3 provided between node ND1 and node ND2 and functions as a load, and a capacitive element CP provided between node ND2 and the ground.

NMOS transistor N3 is diode-connected. Charge circuit 83 is capable of storing electric charge at a time constant R×C, where C is a load resistance value of capacitive element CP and R is a load resistance value of N-channel MOS transistor N3.

The voltage stored in capacitive element CP, namely voltage vmg_charge of node ND2, can be discharged by activating first discharge circuit 82. NMOS transistor N3 has a high resistance, and therefore, discharge by first discharge circuit 82 does not cause the voltage of node ND1 to decrease.

First discharge circuit 82 includes an NMOS transistor Ni provided between node ND2 and the ground. NMOS transistor N1 has its gate to which control signal live_pulse is input. When control signal live_pulse is activated to "H" level, NMOS transistor N1 is turned on. Accordingly, node ND2 and the ground are connected to each other and voltage vmg_charge of node ND2 is discharged.

Second discharge circuit 84 includes an NMOS transistor N2 provided between node ND1 and the ground. NMOS transistor N2 has its gate connected to node ND2 and reset request circuit 41. When voltage vmg_charge of node ND2 becomes higher than a threshold voltage TH (on the order of 1 V), NMOS transistor N2 is turned on. Accordingly, node ND1 and the ground are connected to each other and memory gate voltage Vmg of node ND1 is discharged directly to the ground (pulled out).

The above-described transistors and capacitive element have the characteristics for example that capacitive element CP has C of approximately 5 transistor N1 has L of 1 μm and W of 10 μ approximately, transistor N2 has L of 1 μm and W of 20 μ approximately, and transistor N3 has L of 200 μm and W of 1 μ approximately, where C is the capacitance of the capacitive element, L is the gate length of the transistor, and W is the gate width of the transistor.

Reset request circuit 41 included in control logic unit 20 includes a former-stage inverter IV1 formed by a PMOS transistor P4 and an NMOS transistor N4, and a latter-stage inverter IV2 formed by a PMOS transistor P5 and an NMOS transistor N5. Inverter IV1 has its input connected with node ND2. Inverter IV2 outputs control signal voltdown for requesting reset of the whole microcomputer 51. The threshold voltage of inverter IV1 and inverter IV2 is identical to threshold voltage TH of NMOS transistor N2.

Reset request circuit 41 is configured in this manner to activate control signal voltdown to "H" level when the voltage of node ND2 exceeds threshold voltage TH.

Operation where short interruption of the internal power supply does not occur

Figure 7:
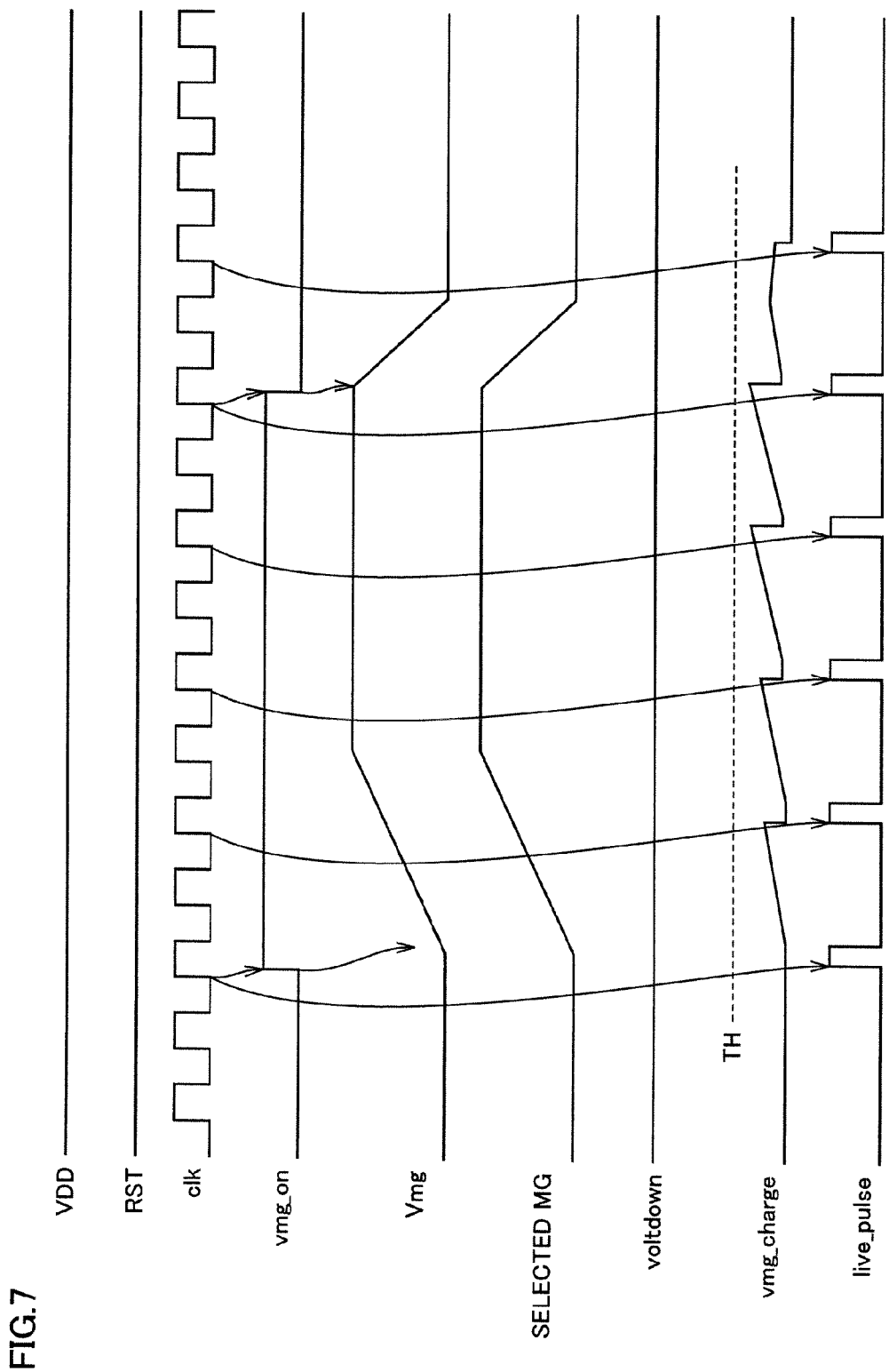
FIG. 7 is a normal timing chart of writing during which short interruption of an internal power supply does not occur in a first embodiment.

FIG. 7 is a normal timing chart of writing during which short interruption of the internal power supply does not occur in the first embodiment.

Referring to FIG. 7, in response to input of a write command, control logic unit 20 activates control signal vmg_on to "H" level in synchronization with clock clk, and internal voltage generation circuit 30 steps up memory gate voltage Vmg. Accordingly, the voltage of voltage control line MMG (not shown) and the voltage of a selected memory gate line MG increase. As memory gate voltage Vmg increases, electric charge is stored in capacitive element CP of charge circuit 83, and voltage vmg_charge of node ND2 increases at a rate lower than the rate at which memory gate voltage Vmg increases.

Meanwhile, in response to activation of control signal vmg_on to "H" level, discharge control unit 44 of control logic unit 20 activates control signal live_pulse to "H" level in the form of one-shot pulse at a half frequency of internal clock clk.

In response to activation of control signal live_pulse to "H" level, NMOS transistor N1 of first discharge circuit 82 is turned on to discharge voltage vmg_charge of node ND2. Then, in response control signal live_pulse returning to "L" level, NMOS transistor N1 of first discharge circuit 82 is turned off and voltage vmg_charge of node ND2 is increased again. In response to the next activation of control signal live_pulse to "H" level, the increased voltage vmg_charge of node ND2 is discharged again.

The above-described operation is repeated and accordingly writing is completed.

Then, control logic unit 20 inactivates control signal vmg_on to "L" level in synchronization with clock clk, and internal voltage generation circuit 30 steps down memory gate voltage Vmg. Accordingly, the voltage of voltage control line MMG and the voltage of the selected memory gate line MG decrease. When memory gate voltage Vmg reaches to the ground level, no electric charge is stored in capacitive element CP of charge circuit 83, and voltage vmg_charge of node ND2 also decreases to the ground level.

As shown in FIG. 7, in the case where short interruption of the internal power supply does not occur and first discharge circuit 82 periodically discharges the voltage stored in charge circuit 83 to the ground level, second discharge circuit 84 does not operate and memory gate voltage Vmg is applied to a selected memory gate line MG through voltage control line MMG to be used for normal rewriting.

Operation where short interruption of the internal power supply occurs

Figure 8:
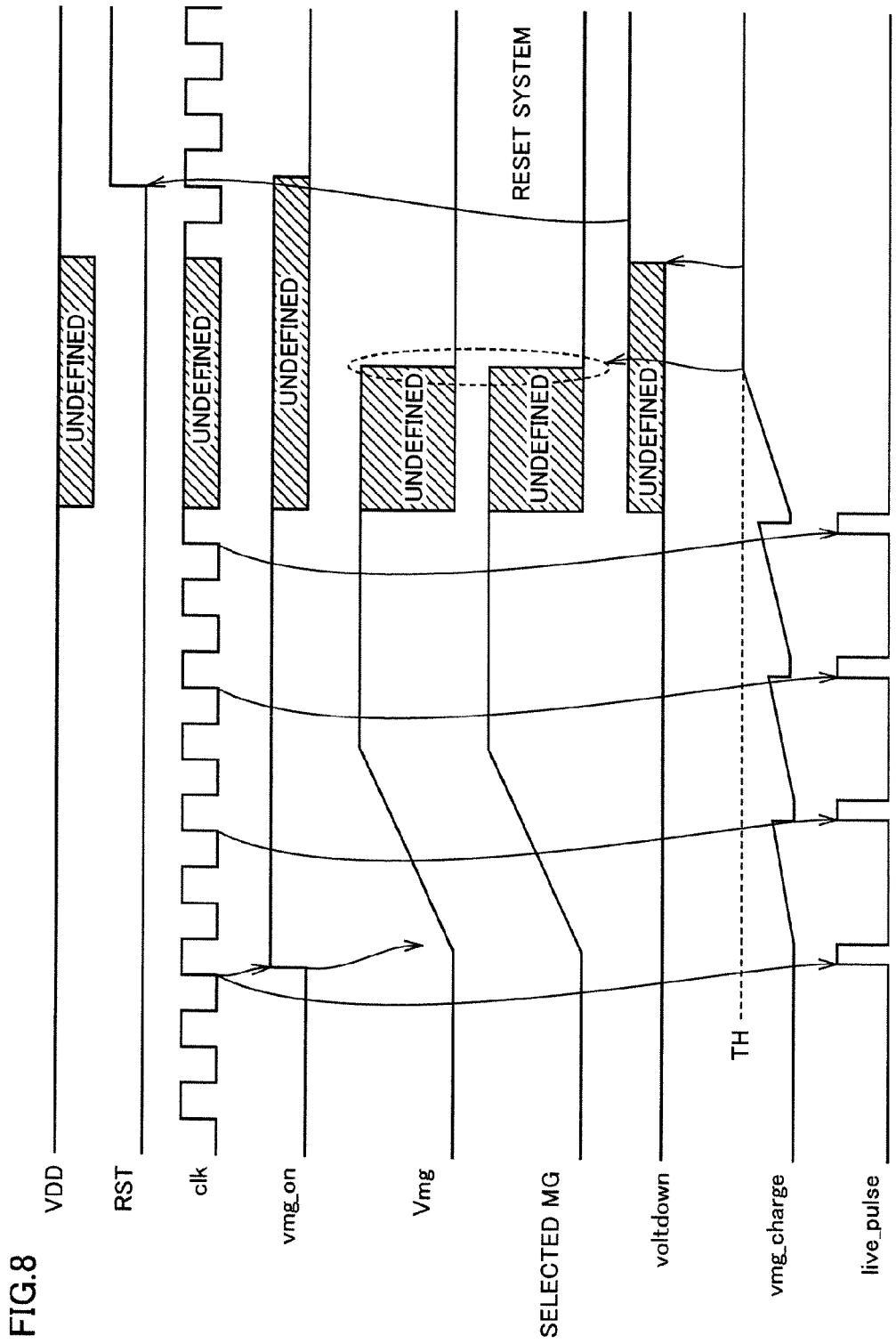
FIG. 8 is a timing chart of writing during which short interruption of an internal power supply occurs in the first embodiment.

FIG. 8 is a timing chart of writing during which short interruption of the internal power supply occurs in the first embodiment.

When short interruption of the internal power supply occurs, reference voltage VDD, clock clk, control signal vmg_on, memory gate voltage Vmg, the voltage of voltage control line MMG (not shown), the voltage of a selected memory gate line MG, and control signal voltdown become undefined.

Since clock clk is undefined, control signal live_pulse is not regularly activated in the form of one-shot pulse. Therefore, voltage vmg_charge of node ND2 is not discharged by first discharge circuit 82 and thus continues increasing.

When voltage vmg_charge of node ND2 exceeds threshold voltage TH, NMOS transistor N2 of second discharge circuit 84 is turned on to discharge gate voltage Vmg to the ground level. Accordingly, the voltage of voltage control line MMG and the voltage of the selected memory gate line MG are decreased to the ground level.

Meanwhile, in response to voltage vmg_charge of node ND2 exceeding threshold voltage TH, reset request circuit 41 activates control signal voltdown to "H" level. Receiving control signal voltdown of "H" level, system controller 71 resets the whole microcomputer 51.

Notes for reference sake:

A description will be given below of an operation in a conventional example without power-supply short interruption detection and high-voltage discharge circuit 40.

Figure 9:
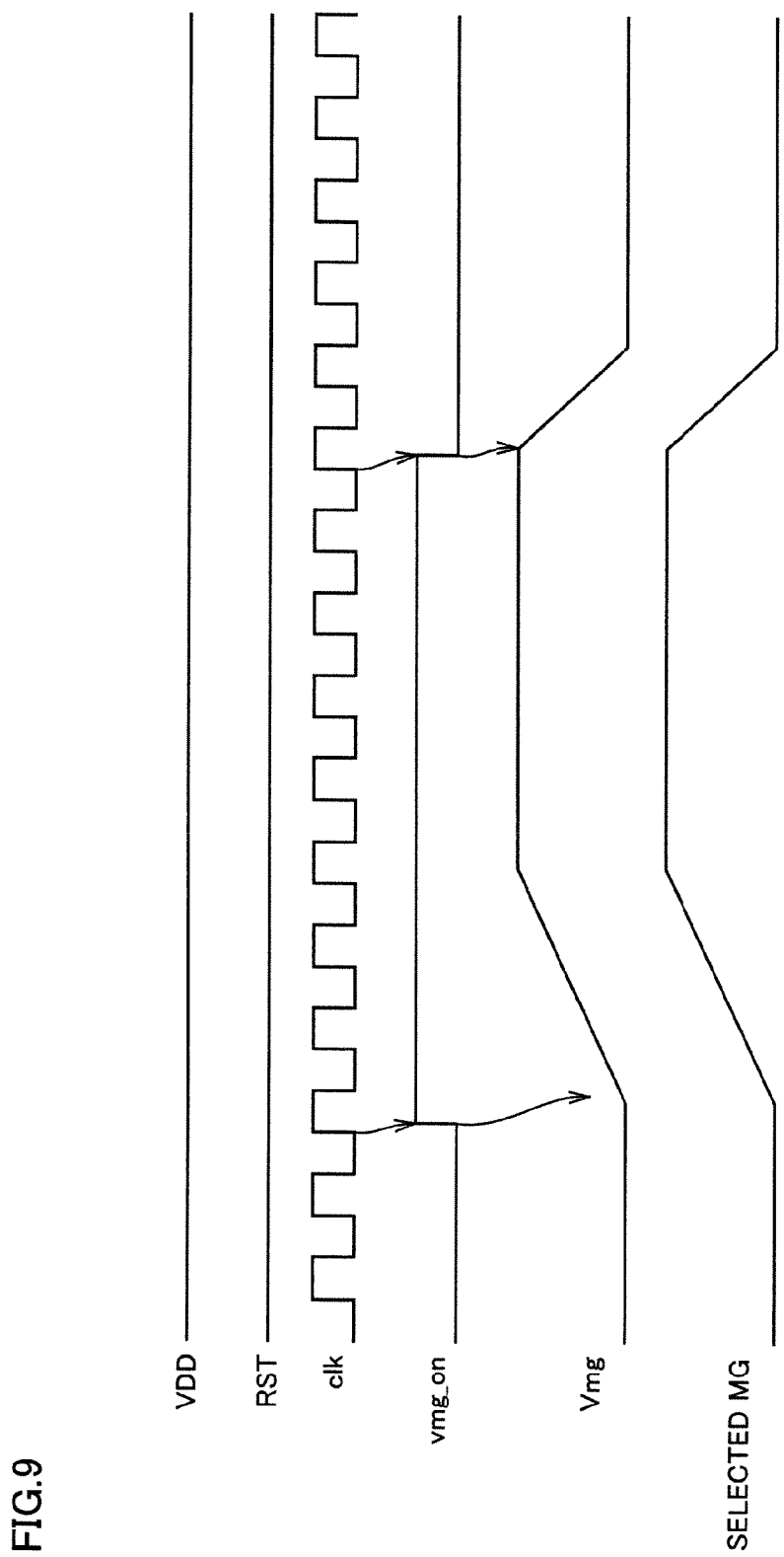
FIG. 9 is a normal timing chart of conventional writing during which short interruption of an internal power supply does not occur.

FIG. 9 is a normal timing chart of conventional writing during which short interruption of the internal power supply does not occur.

In the case where short interruption of the internal power supply does not occur, activation and inactivation of control signal vmg_on cause memory gate voltage Vmg to increase and decrease respectively. Thus, memory gate voltage Vmg is not kept high.

Figure 10:
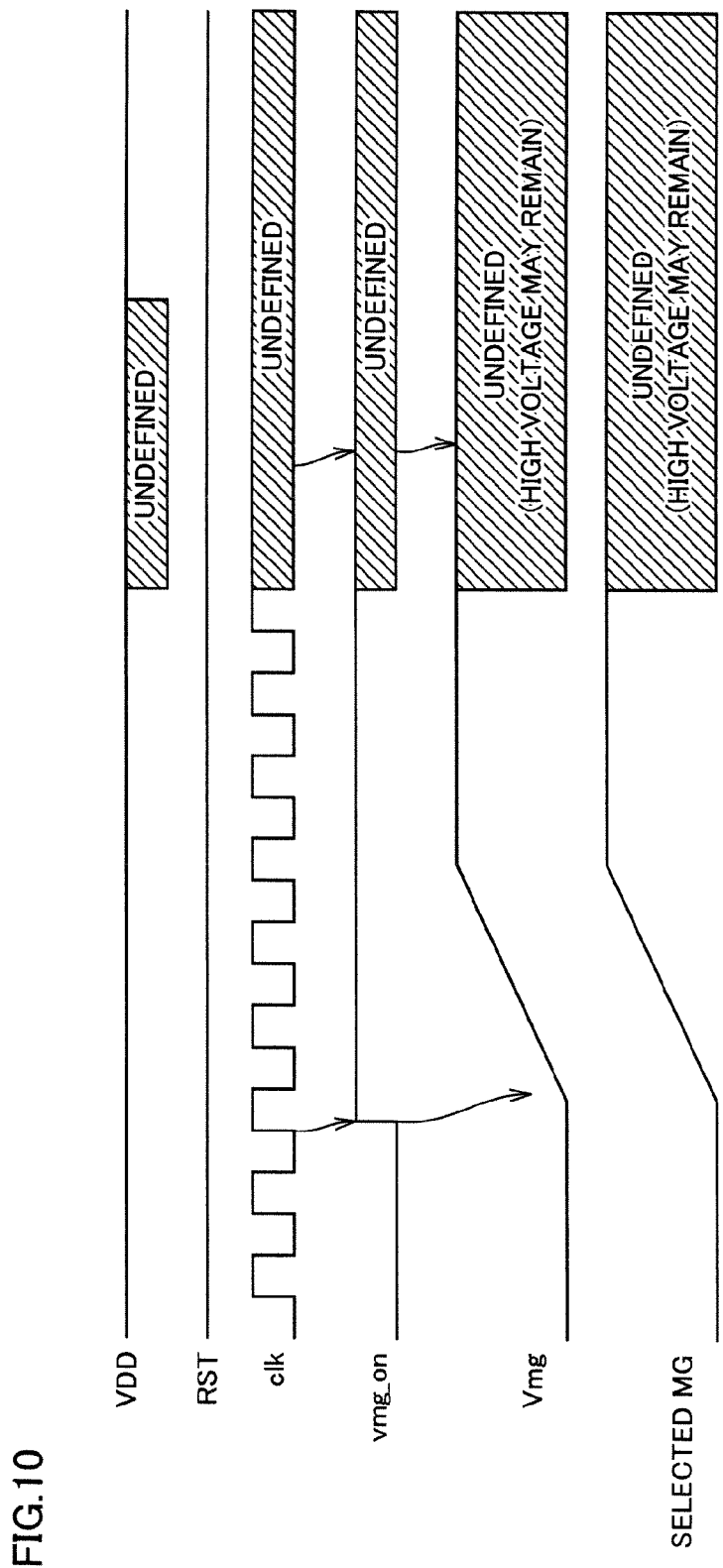
FIG. 10 is a timing chart of conventional writing during which short interruption of an internal power supply occurs.

FIG. 10 is a timing chart of conventional writing during which short interruption of the internal power supply occurs.

When short interruption of the internal power supply occurs, reference voltage VDD, clock clk, and control signal vmg_on become undefined. As a result, memory gate voltage Vmg and the voltage of a selected memory gate line MG also become undefined and may each be kept at a high voltage.

As seen from the foregoing, the present embodiment can appropriately reduce memory gate voltage Vmg even when another power supply voltage has been decreased, since the discharge performed by second discharge circuit 84 is essentially to reduce memory gate voltage Vmg itself which should be reduced. Therefore, a memory cell can be prevented from being erroneously written, or an adverse influence on the transistor's reliability due to a long-time application of a high voltage to the transistor can be prevented.

In addition, even when short interruption occurs to a power supply within nonvolatile semiconductor memory 55 that cannot be detected by system controller 71 which controls the whole microcomputer, the system controller is informed of the short interruption of the internal power supply. Therefore, the system controller can reset the whole microcomputer, so that an adverse influence of the short interruption of the power supply in the nonvolatile semiconductor memory can be prevented from being exerted on other components in the microcomputer.

In the present embodiment, control logic unit 20 activates control signal live_pulse to "H level" in the form of one-shot pulse at a half frequency of internal clock clk. The present invention, however, is not limited to this. For example, in consideration of the relationship between the power supply of a circuit generating control signal live_pulse and the power supply in nonvolatile semiconductor memory 55, such control signal live_pulse which is activated regularly may be received from a sequencer in the system controller which controls the whole semiconductor device.

Figure 11:
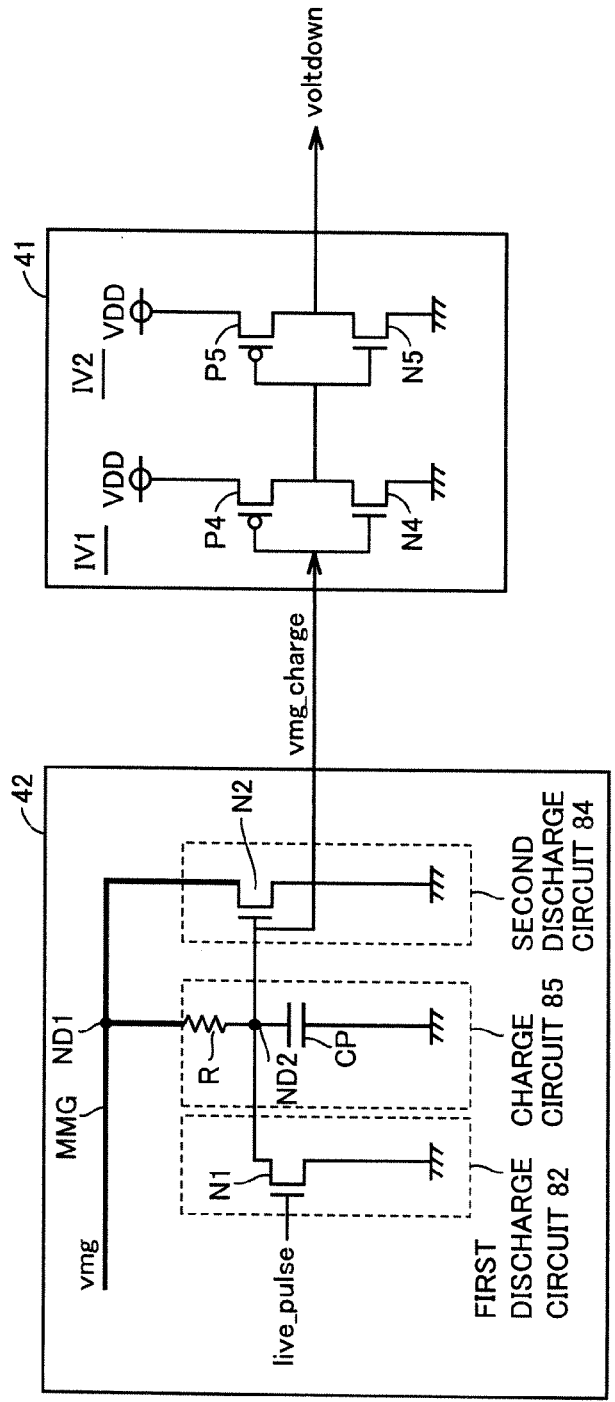
FIG. 11 is a diagram showing a modification of a charge circuit.

In addition, charge circuit 83 shown in FIG. 6 may include a resistive element R like that of a charge circuit 85 shown in FIG. 11, instead of NMOS transistor N3.

[Second Embodiment]

In the first embodiment, a periodic one-shot pulse is used as control signal live_pulse. Control signal live_pulse applied to first discharge circuit 82, however, may be any signal as long as the signal is activated to "H" level when short interruption of an internal power supply does not occur and inactivated to "L" level upon occurrence of short interruption of the internal power supply. The present embodiment provides another example of control signal live_pulse whose level is changed in the aforementioned manner.

Discharge Control Unit

Figure 12:
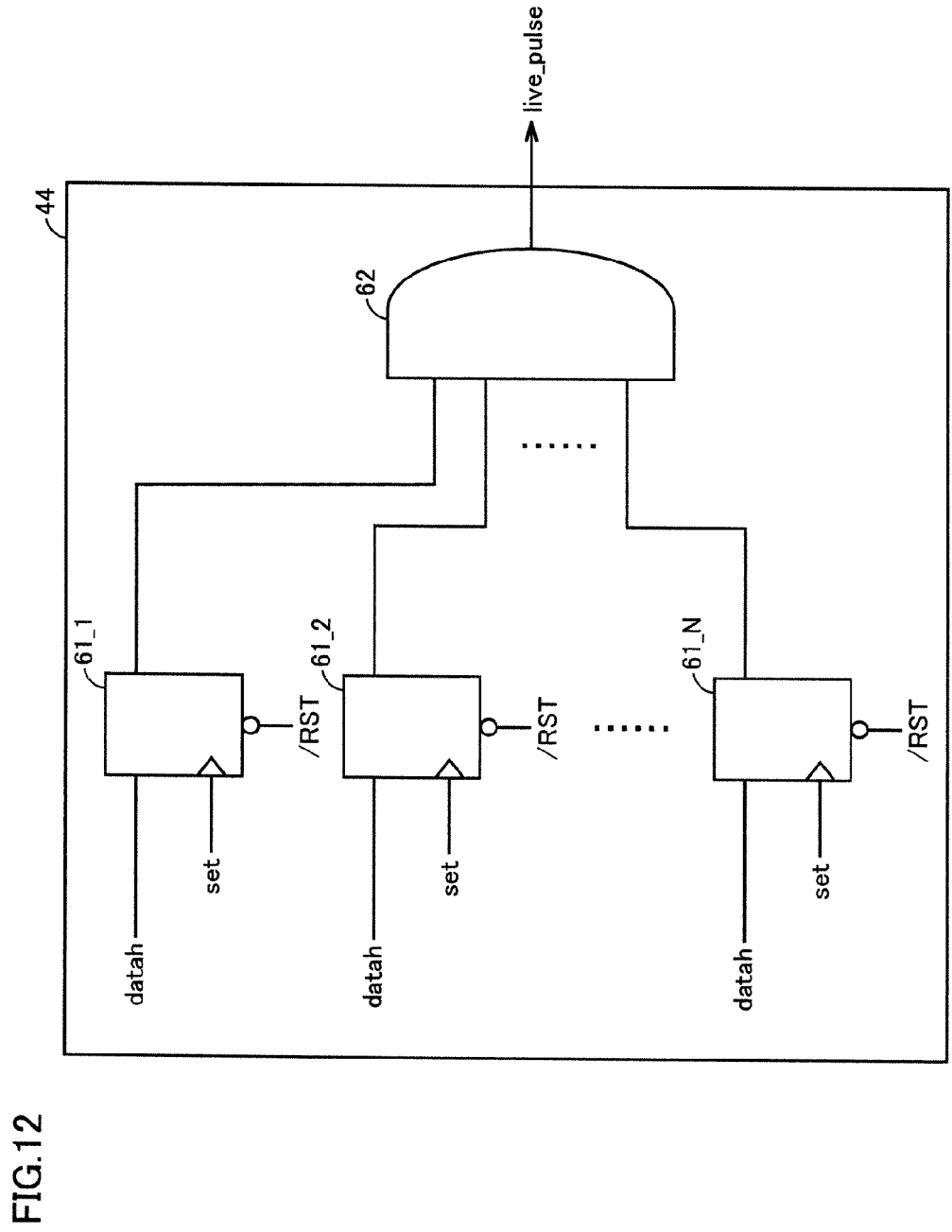
FIG. 12 is a diagram showing a configuration of a discharge control unit in a second embodiment.

FIG. 12 is a diagram showing a configuration of a discharge control unit 44 in a second embodiment.

As shown in FIG. 12, discharge control unit 44 includes a plurality of flip-flops 61_1 to 61_N, and a logical product circuit 62 which outputs a logical product of respective outputs of a plurality of flip-flops 61_1 to 61_N. A MOS transistor which is a component in at least one flip-flop of these flip flops 61_1 to 61_N has a size (gate length and gate width) different from the size of MOS transistors in other flip-flops.

Alternatively, the flip-flops may be different from each other in size of respective MOS transistors.

In the example shown in FIG. 12, the power supply voltage of a plurality of flip-flops is reference voltage VDD.

Before writing, a datah signal and a set signal that are input to flip-flops 61_1 to 61_N are controlled so that "H" level is stored and output, to thereby set control signal live_pulse to "H" level. When all outputs given respectively from a plurality of flip-flops 61_1 to 61_N have "H" level, control signal live_pulse has "H" level.

After writing, the datah signal and the set signal that are input to flip-flops 61_1 to 61_N are controlled so that "L" level is stored in and output from flip-flops 61_1 to 61_N, to thereby set control signal live_pulse to "L" level.

When short interruption of the internal power supply does not occur during writing, respective outputs of a plurality of flip-flops 61_1 to 61_N are kept at "H" level, and therefore control signal live_pulse is kept at "H" level. While control signal live_pulse is "H" level, voltage vmg_charge of node ND2 is kept at the ground level.

When short interruption of the internal power supply occurs during writing, some of a plurality of flip-flops 61_1 to 61_N output "H" level and the other flip-flops output "L" level, since respective sizes of a plurality of flip-flops 61_1 to 61_N are not made identical to each other. As a result, control signal live_pulse has "L" level. Live_pulse having "L" level causes the voltage of node ND2 to gradually increase. When voltage vmg_charge of node ND2 exceeds threshold voltage TH, the second discharge circuit directly discharges the high memory gate voltage Vmg of node ND1, which is similar to the first embodiment.

Operation

FIG. 13 is a timing chart of writing during which short interruption of the internal power supply occurs in the second embodiment.

Referring to FIG. 13, in response to input of a write command, control logic unit 20 activates control signal vmg_on to "H" level in synchronization with clock clk, and internal voltage generation circuit 30 causes memory gate voltage Vmg to increase. Accordingly, the voltage of a selected memory gate line MG is also increased.

Meanwhile, discharge control unit 44 of control logic unit 20 outputs live_pulse of "H" level in synchronization with clock clk, and continues outputting this signal kept at "H" level. Accordingly, NMOS transistor N1 of first discharge circuit 82 is turned on. Therefore, electric charge is not stored in capacitive element CP of charge circuit 83 and voltage vmg_charge of node ND2 does not increase.

When short interruption of the internal power supply occurs, reference voltage VDD, clock clk, control signal vmg_on, memory gate voltage Vmg, the voltage of the selected memory gate line MG, and control signal voltdown become undefined. Meanwhile, control signal live_pulse which is output from discharge control unit 44 of control logic unit 20 does not become undefined and changes to "L" level. Accordingly, NMOS transistor N1 of first discharge circuit 82 is turned off. Therefore, electric charge is stored in capacitive element CP of charge circuit 83 and voltage vmg_charge of node ND2 continues increasing.

When voltage vmg_charge of node ND2 exceeds threshold voltage TH, NMOS transistor N2 of second discharge circuit 84 is turned on and memory gate voltage Vmg is discharged to the ground level. Accordingly, the voltage of the selected memory gate line MG is also reduced to the ground level.

In response to voltage vmg_charge of node ND2 exceeding threshold voltage TH, reset request circuit 41 activates control signal voltdown to "H" level. Receiving control signal voltdown of "H" level, system controller 71 resets the whole microcomputer 51.

As seen from the foregoing, the present embodiment can, like the first embodiment, appropriately reduce memory gate voltage Vmg even when another power supply voltage has been decreased, since the discharge performed by the second discharge circuit is to reduce memory gate voltage Vmg itself. Further, like the first embodiment, even when short interruption occurs to a power supply within the nonvolatile semiconductor memory that cannot be detected by the system controller, the present embodiment allows the system controller to be informed of the short interruption of the power supply in the nonvolatile semiconductor memory and therefore the system controller can reset the whole microcomputer.

The precision with which short interruption of an internal power supply is detected can be made higher in the following way. Namely, some of a plurality of flip-flops of the discharge control circuit may each be provided with an inverter in the latter stage and receive the detah signal and the set signal that are controlled to be set to "L" level prior to writing, and the other flip-flops may receive the detah signal and the set signal controlled to be set to "H" level prior to writing.

In the first and second embodiments, memory gate voltage Vmg is discharged upon occurrence of short interruption of an internal power supply. The present invention, however, is not limited to this. Other voltages generated in internal voltage generation circuit 30, namely bit line voltage Vbl, control gate voltage Vcg, or source line voltage Vsl may be discharged.

Further, while the first and second embodiments use, as a power supply voltage of control logic unit 20 (including discharge control unit 44), reference voltage VDD which is generated in internal voltage generation circuit 30 from power supply voltage VCC, the present invention is not limited to this. For example, in such a case where nonvolatile semiconductor memory 55 does not have a reference voltage VDD generation circuit and directly uses, as its power supply voltage, power supply voltage VCC which is applied externally to microcomputer 51, it is inevitable to use power supply voltage VCC also as a power supply voltage of control logic unit 20 (including discharge control unit 44). In such a case as well, control logic unit 20 detects an abnormality of VCC which is its power supply voltage, and uses a control signal to inform power-supply short interruption detection and high-voltage discharge circuit 40 of the abnormality, and accordingly a discharge operation is performed.

While the second embodiment has been described as using reference voltage VDD as a power supply voltage of a plurality of flip-flops, the power supply voltage may alternatively be VCC.

The first and second embodiments have been described as having control logic unit 20, which is formed by a sequence controller performing internal operation control required for execution of an operation mode of nonvolatile semiconductor memory 55, is disposed within nonvolatile semiconductor memory 55. The embodiments are still applicable to the case where control logic unit 20 is disposed in nonvolatile semiconductor memory controller 59.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

Reference Signs List

1 semiconductor substrate region; 2, 3 impurity region; 4 gate insulating film; 5 control gate; 7 insulating film; 7a bottom oxide film; 7b nitride film; 7c top oxide film; 10 memory mat; 12 address buffer; 14 X decoder; 16 Y decoder; 18 Y gate; 20 control logic unit; 22 write driver; 24 sense amplifier; 26 I/O buffer; 30 internal voltage generation circuit; 32 voltage level detection circuit; 34 bit line peripheral circuit; 40 power-supply short interruption detection and high-voltage discharge circuit; 41 reset request circuit; 44 discharge control circuit; 51 microcomputer; 52 peripheral circuit; 53 oscillation circuit; 54 divider circuit; 55 nonvolatile semiconductor memory; 56 bus controller; 57 RAM; 58 CPU; 59 nonvolatile semiconductor memory controller; 60 input/output port; 61_1 to 61_N flip-flop; 62 logical product circuit; 71 system controller; 72 bus; 82 first discharge circuit; 83, 85 charge circuit; 84 second discharge circuit; BCT bit line contact; BL bit line; CG control gate line; CGD control gate drive circuit; MB memory block; MC memory cell; MG memory gate line; MMG voltage control line; MGD memory gate drive circuit; MT memory transistor; GBL global bit line; SL source line; SLD source line drive circuit; ST select transistor; IV1, IV2 inverter; N1, N2, N3, N4, N5 NMOS transistor; P4, P5 PMOS transistor; CP capacitive element; R resistive element

The invention claimed is:

1. A semiconductor device comprising:
    a plurality of memory cells each storing data depending on a change in level of a threshold voltage;
    a voltage generation circuit generating a voltage to be applied to said memory cell;
    a control logic unit generating a control signal activated while a power supply voltage is normally supplied;
    a charge circuit connected to a first node on a voltage control line supplied with the voltage generated by said voltage generation circuit, said charge circuit including a second node and a capacitive element connected to said second node;
    a first discharge circuit connected to said second node, and connecting said second node to a ground when said control signal is activated; and
    a second discharge circuit connecting said first node to said ground when a voltage of said second node exceeds a threshold value.

2. The semiconductor device according to claim 1, wherein said control logic unit generates said control signal periodically activated to indicate that a power supply voltage is normally supplied.

3. The semiconductor device according to claim 1, wherein said control logic unit generates said control signal kept in an activated state to indicate that a power supply voltage is normally supplied.

4. The semiconductor device according to claim 3, wherein said control logic unit includes:
    a plurality of flip-flops; and
    a logic circuit which outputs, as said control signal, a logical product of respective outputs of said plurality of flip-flops, and
    a transistor in at least one of said plurality of flip-flops has a size different from a size of transistors in other flip-flops.

5. The semiconductor device according to claim 1, wherein said first discharge circuit includes a transistor disposed between said second node and the ground and having a control electrode receiving said control signal.

6. The semiconductor device according to claim 1, wherein said second discharge circuit includes a transistor disposed between said first node and the ground and having a control electrode connected to said second node.

7. The semiconductor device according to claim 1, wherein said charge circuit includes: a load element disposed between said first node and said second node; and said capacitive element disposed between said second node and the ground.

8. The semiconductor device according to claim 1, wherein
    said semiconductor device is a microcomputer further comprising a system controller, and
    said semiconductor device further comprises a reset request circuit activating, when the voltage of said second node exceeds said threshold value, a notification signal for requesting said system controller to reset the microcomputer including a nonvolatile semiconductor memory.

9. The semiconductor device according to claim 1, wherein the voltage generated by said voltage generation circuit and supplied to said voltage control line is a memory gate voltage to be applied to a memory gate of said memory cell.

10. A semiconductor device comprising:
    a plurality of memory cells each storing data depending on a change in level of a threshold voltage;
    a voltage generation circuit generating a voltage to be applied to said memory cell;
    a control logic unit generating a control signal periodically activated to indicate that a power supply voltage is normally supplied; and
    a circuit receiving said control signal, detecting short interruption of said power supply voltage from said control signal failing to be regularly activated, and accordingly discharging a voltage of a first node on a voltage control line supplied with the voltage generated by said voltage generation circuit.

* * * * *